(12) United States Patent
Mezenner et al.

(10) Patent No.: US 7,419,609 B2
(45) Date of Patent: Sep. 2, 2008

(54) METHOD FOR QUANTIFYING OVER-ETCH OF A CONDUCTIVE FEATURE

(75) Inventors: Raba Mezenner, Richardson, TX (US); Kiyomi Hirose, Tsukuba (JP); Satoshi Suzuki, Miho Inashiki Gun (JP)

(73) Assignee: Texas Instruments Incorporated, Dallas, TX (US)

( * ) Notice: Subject to any disclaimer, the term of this patent is extended or adjusted under 35 U.S.C. 154(b) by 5 days.

(21) Appl. No.: 11/558,995

(22) Filed: Nov. 13, 2006

(65) Prior Publication Data

US 2008/0113087 A1    May 15, 2008

(51) Int. Cl.
*B05D 5/12*   (2006.01)
*H01B 13/00*  (2006.01)

(52) U.S. Cl. ...................................................... 216/13
(58) Field of Classification Search ........................ None
See application file for complete search history.

(56) References Cited

U.S. PATENT DOCUMENTS

| | | | | |
|---|---|---|---|---|
| 4,516,071 A | * | 5/1985 | Buehler | 324/765 |
| 4,560,583 A | * | 12/1985 | Moksvold | 438/11 |
| 5,390,420 A | * | 2/1995 | Schultz | 33/286 |
| 6,057,171 A | * | 5/2000 | Chou et al. | 438/15 |
| 6,087,189 A | * | 7/2000 | Huang | 438/10 |
| 6,291,254 B1 | * | 9/2001 | Chou et al. | 438/18 |
| 6,312,963 B1 | * | 11/2001 | Chou et al. | 438/18 |
| 6,403,389 B1 | * | 6/2002 | Chang et al. | 438/18 |
| 6,822,260 B1 | * | 11/2004 | Nariman et al. | 257/48 |
| 6,844,751 B2 | * | 1/2005 | Marshall et al. | 324/765 |
| 6,854,100 B1 | * | 2/2005 | Chuang et al. | 716/5 |
| 2003/0229410 A1 | * | 12/2003 | Smith et al. | 700/109 |
| 2005/0132306 A1 | * | 6/2005 | Smith et al. | 716/1 |
| 2005/0242870 A1 | * | 11/2005 | Aota | 327/541 |
| 2006/0255825 A1 | * | 11/2006 | Smayling et al. | 324/765 |
| 2007/0145998 A1 | * | 6/2007 | Smayling et al. | 324/765 |

* cited by examiner

*Primary Examiner*—Allan Olsen
(74) *Attorney, Agent, or Firm*—Wade James Brady, III; Frederick J. Telecky, Jr.

(57) ABSTRACT

The invention provides a method for quantifying over-etch of a conductive feature. In one embodiment, this method includes forming a conductive feature over a substrate, the conductive feature having a sheet resistance test structure associated therewith, the sheet resistance test structure having a first sheet resistance value. This method may further include etching the conductive feature and the sheet resistance test structure using a common etch process, obtaining a second sheet resistance value of the sheet resistance test structure after the etching, and quantifying an amount of over-etch into the conductive feature using the first and second sheet resistance values.

19 Claims, 7 Drawing Sheets

METHOD FOR QUANTIFYING OVER-ETCH OF A CONDUCTIVE FEATURE

TECHNICAL FIELD OF THE INVENTION

The invention is directed, in general, to a method for manufacturing a microelectronic device and, more specifically, to one that quantifies over-etch of a conductive feature.

BACKGROUND OF THE INVENTION

A Digital Micromirror Device (DMD) is a type of microelectro-mechanical systems (MEMS) device. Invented in 1987 at Texas Instruments Incorporated, the DMD is a fast, reflective digital light switch. It can be combined with image processing, memory, a light source, and optics to form a digital light processing® system capable of projecting large, bright, high-contrast color images.

The DMD is fabricated using CMOS-like processes over a CMOS memory. It has an array of individually addressable mirror elements, each having a mirror that can reflect light in one of a plurality of directions depending on the state of an underlying memory cell. By combining the DMD with a suitable light source and projection optics, the mirror reflects incident light either into or out of the pupil of the projection lens. Thus, the first state of the mirror appears bright and the second state of the mirror appears dark. Gray scale is achieved by binary pulse width modulation of the incident light. Color is achieved by using color filters, either stationary or rotating, in combination with one, two, or three DMD chips.

DMD's may have a variety of designs, with the most popular design being a structure consisting of a mirror that is rigidly connected to an underlying binge layer. The binge layer is connected by two thin mechanically compliant torsion hinges to support posts that are attached to the underlying substrate. Electrostatic fields that develop between the underlying memory cell and the mirror cause rotation in the positive or negative rotation direction.

The fabrication of the above-described DMD superstructure begins with a completed CMOS memory circuit. Through the use of photoresist layers, the superstructure is formed with alternating layers of aluminum for the address electrode, binge, yoke, and mirror layers and hardened photoresist for sacrificial layers that form air gaps. Unfortunately, the manufacture of the elements of the superstructure may be difficult, particularly when using the photoresist as a support material.

Accordingly, what is needed in the art is a method for manufacturing a microelectronic device, such as a DMD, that does not experience the drawbacks of the prior art methods.

SUMMARY OF THE INVENTION

To address the above-discussed deficiencies of the prior art, the invention provides a method for quantifying over-etch of a conductive feature. In one embodiment, this method includes forming a conductive feature over a substrate, the conductive feature having a sheet resistance test structure associated therewith, wherein the sheet resistance test structure has a first sheet resistance value. This method further includes etching the conductive feature and the sheet resistance test structure using a common etch process. A second sheet resistance value of the sheet resistance test structure is obtained after the etching, and an amount of over-etch into the conductive feature using the first and second sheet resistance values is quantified.

The invention further provides a method for manufacturing a microelectronic device. The method for manufacturing the microelectronic device, in one embodiment, may include: 1) forming a conductive feature over a substrate, the conductive feature having a sheet resistance test structure associated therewith, the sheet resistance test structure having a first sheet resistance value; 2) forming a photoresist spacer layer over the conductive feature, the photoresist spacer layer having one or more openings therein; 3) etching the sheet resistance test structure and etching the conductive feature through the one or more openings in the photoresist spacer layer using a common etch process; 4) obtaining a second sheet resistance value of the sheet resistance test structure after the etching; 5) quantifying an amount of over-etch into the conductive feature using the first and second sheet resistance values; and 6) forming a conductive layer over the photoresist spacer layer and within the one or more openings.

BRIEF DESCRIPTION OF THE DRAWINGS

For a more complete understanding of the invention, reference is now made to the following descriptions taken in conjunction with the accompanying drawings, in which:

FIGS. 1A-6 illustrate views showing how one might, in an embodiment, manufacture a DMD in accordance with the invention;

DETAILED DESCRIPTION

The invention recognizes that via profiles of posts that connect a binge metal layer to an underlying conductive feature in a DMD superstructure are important to the operation and reliability thereof. The invention also recognizes that significant over-etching into the conductive feature during the formation of the posts can cause the via profiles of the posts to be such that the posts experience failure and that under-etching into the conductive feature provides problems of its own. Further, conventional etch-stop layers may not generally be used in a DMD structure.

Based upon substantial experimentation and the foregoing recognitions, the invention provides that the amount of over-etch of the conductive feature can be quantified by using an electrical method. In one example, the invention provides that a change in sheet resistance (e.g., a ratio of sheet resistances) can be used to quantify the amount of over-etch of the conductive feature. In one aspect, a sheet resistance test structure may be formed over the same substrate as the conductive layer. Thereafter, a measurement of the sheet resistance of the test structure (e.g., before and after the test structure and the conductive feature are subjected to a common etch process) may be compared. This comparison can be used to quantify the amount of over-etch of the conductive feature.

The method for quantifying over-etch of a conductive feature may be employed on structures other than DMD's. For instance, it may be employed in any device irrespective of whether it is included within a DMD device. Accordingly, the invention should not be limited to any specific device, including a DMD device.

Figure 1A:
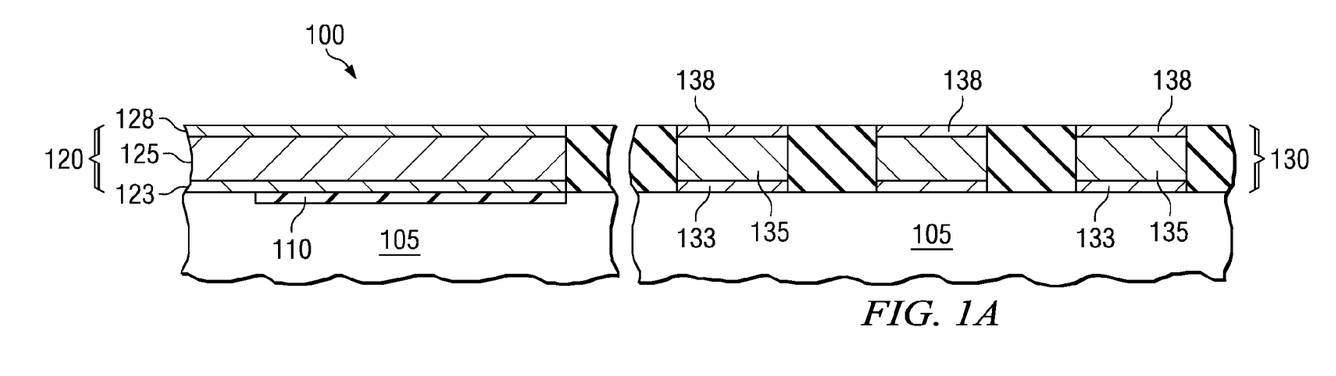

FIGS. 1A-6 illustrate views showing how one might, in an embodiment, manufacture a DMD 100 in accordance with the invention. FIG. 1A illustrates the DMD 100 at an initial stage of manufacture. The DMD 100 of FIG. 1A includes control circuitry 110 formed on or in a substrate 105. The substrate 105 may comprise a number of different materials while staying within the scope of the invention. In the embodiment illustrated in FIG. 1A, however, the substrate 105 is epitaxial silicon.

The control circuitry 110 may comprise a plurality of CMOS devices, and in one embodiment, addressable SRAM circuits within the substrate 105. Nevertheless, other embodiments may exist wherein additional or different circuitry may be included within the control circuitry 110. While not shown, the DMD 100 may further include an insulating layer formed over the control circuitry 110. The insulating layer preferably comprises an oxide, such as silicon oxide, which has been planarized by chemical mechanical planarization.

Located over the substrate 105 is a conductive feature 120. The conductive feature 120 may comprise many different materials and layers and remain true to the invention. In one embodiment, however, the feature 120 includes a first layer 123, a second layer 125, and a third layer 128. The first layer 123, in this embodiment, might comprise a first titanium nitride layer. Additionally, the second layer 125 might comprise a conductive material. For example, the second layer 125 might comprise aluminum or an aluminum alloy sputter deposited to a thickness ranging from about 100 nm to about 400 nm. The third layer 128, similar to the first layer 123, might comprise a second titanium nitride layer. While not shown, a dielectric layer, such as an oxide, may be positioned over the third layer 128.

It should be noted that the conductive feature 120 illustrated in FIG. 1A need not always include each of the first, second and third layers 123, 125, 128. For instance, it could comprise any one or combination of the first, second and third layers 123, 125, 128, as long as at least one of the layers includes conductive properties.

While not shown in FIG. 1A, vias would typically be formed in the insulating layer located over the control circuitry 110 to allow the conductive feature 120 to contact the underlying control circuitry 110, where necessary. The conductive feature 120 may also be patterned, resulting in electrode pads and a bias bus. In one embodiment, the conductive feature 120 may be patterned by plasma-etching using plasma-deposited silicon dioxide as the etch mask.

In one embodiment, a sheet resistance test structure 130 is located over the substrate 105 and associated with the conductive feature 120. A sheet resistance test structure (e.g., test structure 130), as used herein, is any physical structure that has a measurable sheet resistance value. The term "associated," as used herein, means that the test structure 130 includes a conductive layer similar in material, if not identical, to the conductive layer of the conductive feature 120 ultimately etched (e.g., the second layer 125 in this embodiment). It is important that the conductive layer of the test structure 130 and the conductive layer of the conductive feature 120 comprise a similar material. This is beneficial in those embodiments where subsequent etching of the test structure 130 is used to quantify the over-etch of the feature 120. Accordingly, in many embodiments, the feature 120 and the test structure 130 are simultaneously formed, and thus comprise identical layers. Nevertheless, other embodiments may exist wherein the feature 120 and the test structure 130 are not entirely identical, but the material composition of the conductive layer of the feature 120 and the conductive layer of the test structure 130 are similar such that the etch rate of each layer is substantially the same, if not identical.

The test structure 130 illustrated in FIG. 1A includes a first layer 133, a second layer 135 and a third layer 138. In the given embodiment of FIG. 1A, the first layer 133, second layer 135 and the third layer 138 are substantially similar to the first layer 123, second layer 125 and the third layer 128 of the conductive feature 120, respectively. For example, in this embodiment the feature 120 and the test structure 130 were simultaneously formed. The test structure 130, in the illustrated embodiment, is located within a scribe line of a semiconductor wafer. Nevertheless, it may be positioned in different locations on a semiconductor wafer.

Figure 1B:
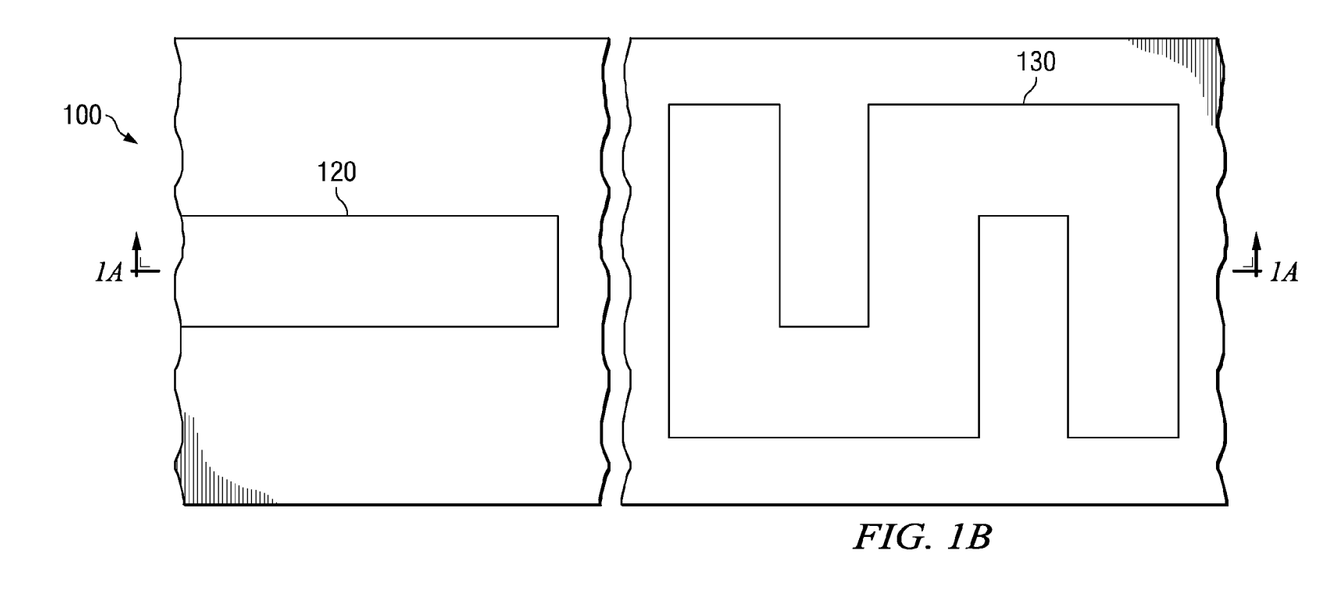

FIG. 1B illustrates a plan view of the DMD 100 of FIG. 1A. As illustrated in FIG. 1B, the test structure 130 may comprise many different shapes. In this embodiment, however, the test structure 130 comprises a serpentine shape. Nonetheless, other shapes might be used and remain within the purview of the invention.

The test structure 130 may not always be a newly added feature intended only for quantifying an amount of over-etch of the conductive feature 120. For instance, in certain embodiments the test structure 130 would already be included within the DMD 100 to measure an as-formed thickness of the feature 120. In this embodiment, the test structure 130 would be used to inform the manufacturer of the DMD 100 as to the specific thickness the feature 120 was deposited to, or at least the conductive portion thereof, as well as inform the manufacturer as to the amount of over-etch of the feature 120. Accordingly, the inclusion of the test structure 130, in certain instances, adds no additional steps. Nevertheless, other embodiments exist wherein the test structure 130 must be added to quantify the amount of over-etch of the feature 120.

Figure 2:
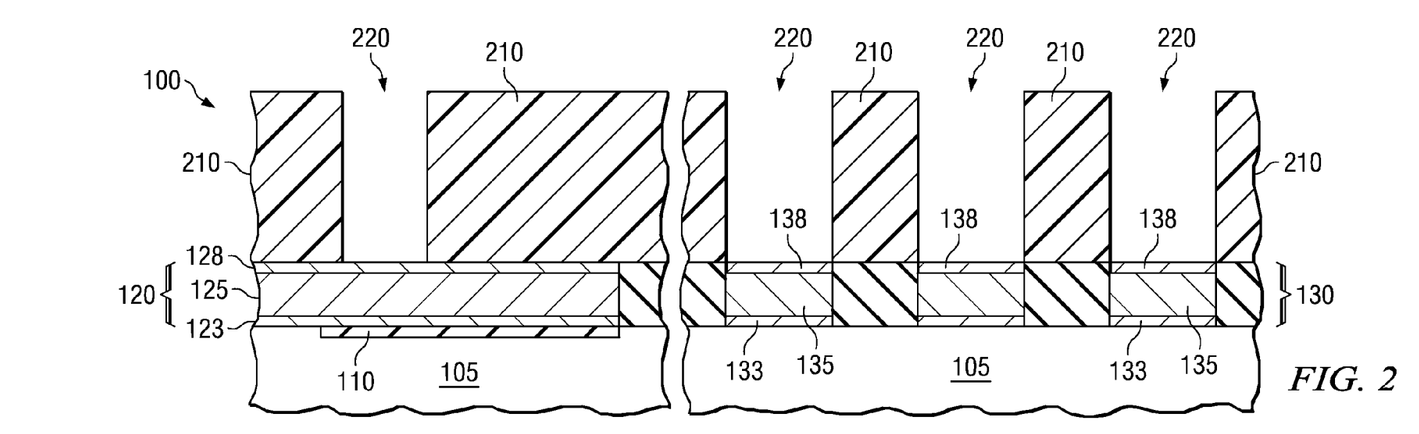

FIG. 2 illustrates the DMD 100 of FIG. 1A after positioning a first spacer layer 210 over the test structure 130. As illustrated, the first spacer layer 210 typically has one or more openings 220 located therein. For example, in one embodiment, the first spacer layer 210 is formed by spin depositing a resist (e.g., a material that would be materially affected by a pre-metal deposition clean if subjected thereto) to a thickness ranging from about 400 nm to about 1500 nm. Thereafter, the one or more openings 220 may be formed within the first spacer layer 210.

Conventional patterning and etching techniques may be used to form the openings 220 in the first spacer layer 210. For example, the openings 220 may be patterned into the first spacer layer 210 by exposing, patterning, developing, and descuming the first spacer layer 210. After patterning the openings 220, the first spacer layer 210 may be deep UV hardened to a temperature of about 200° C. to prevent flow and bubbling during subsequent processing steps.

As illustrated, the openings 220 should expose at least a portion of the conductive feature 120 and the sheet resistance test structure 130. In the embodiment of FIG. 2, the openings 220 expose an entire portion of the test structure 130. Nevertheless, this need not always be the case.

It should be noted that certain embodiments exist wherein the first spacer layer 210 is formed over the conductive feature 120 and not over the sheet resistance test structure 130. In this embodiment, the conductive feature 120 would be exposed by an opening 220 in the first spacer layer 210. Other scenarios might also exist.

At some point prior to etching the conductive feature 120 and the sheet resistance test structure 130 (e.g., as described below with respect to FIG. 3), a first sheet resistance value (RS1) of the test structure 130 should be measured. Those skilled in the art understand the processes that might be used to measure this first sheet resistance value (RS1). For instance, opposing ends of the test structure 130 could be probed with an ohm meter, thereby sending a current across the test structure 130 and measuring a voltage drop, to obtain the first sheet resistance value (RS1).

Figure 3:
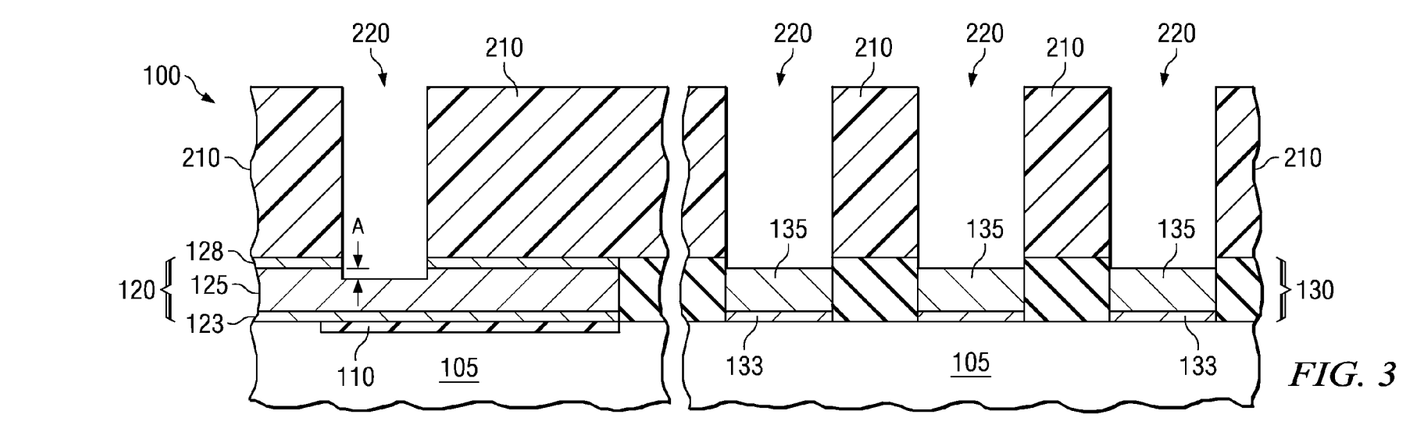

FIG. 3 illustrates the DMD 100 of FIG. 2 after etching the conductive feature 120 and the sheet resistance test structure 130 using a common etch process. The phrase "common etch process" as used herein, means that the process for etching the feature 120 and the test structure 130 is such that the feature 120 and the test structure 130 are etched at substantially the same, if not an identical rate. In one embodiment, the etch process used to etch both structures is virtually identical, except for minor differences attributable to process fluctuations. For example, the type of etch, time for etching, and most all of the related variables for the etching are the same. In many instances, the feature 120 and the test structure 130 are simultaneously etched using the common etch process. Thus, in this embodiment the etch process would be identical for the feature 120 and the test structure 130. Nevertheless, an embodiment might exist wherein a common etch process is used to etch both the feature 120 and the test structure 130 that was not simultaneous.

The common etch process used to etch the feature 120 and the test structure 130 may vary. Nonetheless, the etch process should, at least in this embodiment, be designed to etch through the third layers 128, 138, and at least partially into the second layers 125, 135. In one embodiment, the etch process might include multiple etchants, for example a first $CHF_3/Cl_2$ etch and a following $BCl_3/Cl_2$ etch. However, those skilled in the art understand that the etch process used, and well as the time of the etch process, will be based upon the materials being etched and other related parameters.

The common etch process used to etch the feature 120 and the test structure 130 is such that the etching of the test structure 130 is representative of the etching of the feature 120, and vice-versa. This being the case, and subsequent to etching the feature 120 and the test structure 130, a second sheet resistance value (RS2) may be obtained for the etched test structure 130. The second sheet resistance value (RS2) could be, and in one embodiment is, obtained using the same procedure used to obtain the first sheet resistance value (RS1).

Knowing the first sheet resistance value (RS1) and the second sheet resistance value (RS2), an amount of over-etch of the feature 120 may be obtained. For example, a ratio between the first and second sheet resistance values (RS1 & RS2) may be used to quantify the over-etch.

In one embodiment, the equation $$A = \frac{RS2 - RS1}{RS1 \times RS2}(K)(e^5),$$

wherein A is the amount of over-etch, RS1 is the first sheet resistance value, RS2 is the second sheet resistance value, and K is a resistance coefficient of the conductive feature 120, could be used to quantify the over-etch of the feature 120. As is evident, the only parameters needed to obtain the over-etch of the feature 120, in this embodiment, are the first sheet resistance value (RS1), second sheet resistance value (RS2) and the resistance coefficient of the feature 120 (e.g., which is similar to the resistance coefficient of the sheet resistance test structure 130 because they comprise the same material). The first sheet resistance value (RS1) and second sheet resistance value (RS2) may be obtained as set-forth above, and the resistance coefficient (K) of the feature 120 is a function of the material properties of the feature 120 and may be obtained using various different sources. Accordingly, not even the as-formed thickness of the feature 120 is needed to quantify the amount of over-etch.

Figure 4:
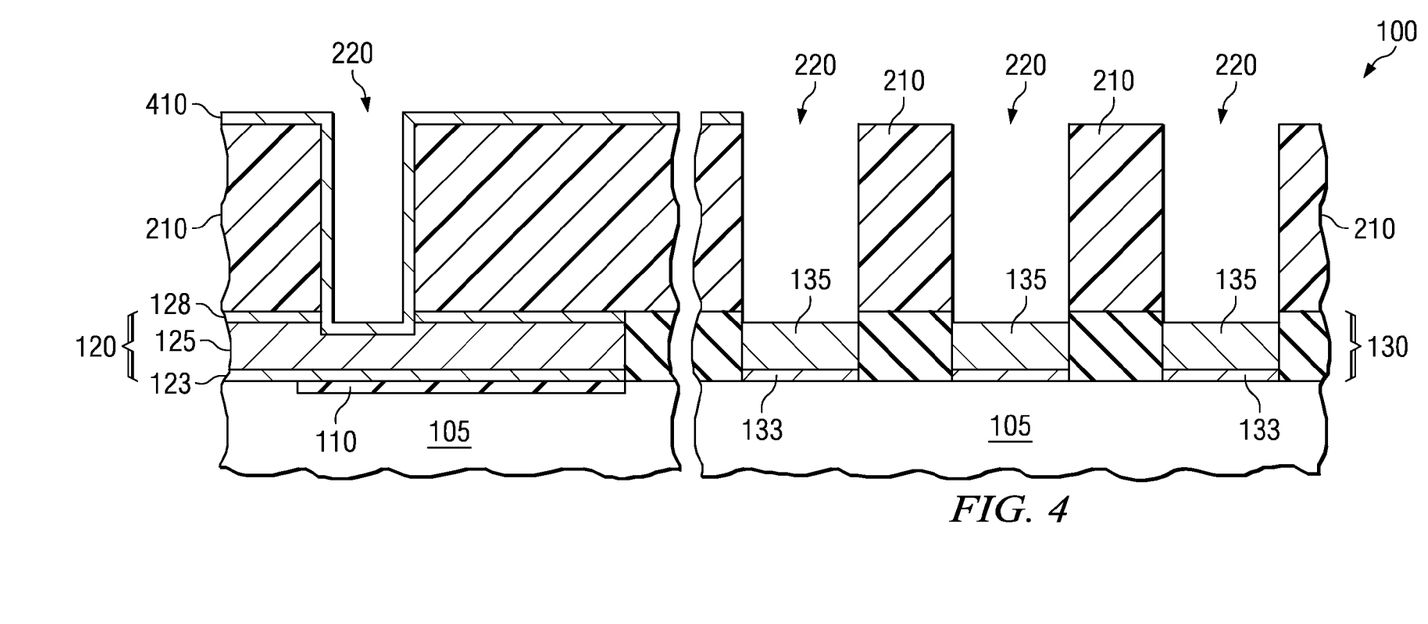

FIG. 4 illustrates the DMD 100 of FIG. 3 after forming a first conductive layer 410 over the first spacer layer 210 and within the openings 220. It is desirable for the conductive layer 410 to substantially cover the spacer layer 210, including substantially covering the tops and sidewalls of the spacer layer 210, and thereby forming a well of sorts. The conductive layer 410, in one embodiment, is a first metal layer comprising aluminum or an alloy thereof. Nevertheless, the conductive layer 410 may comprise other materials. In the embodiment shown, the conductive layer 410 forms at least a portion of a hinge metal layer, also referred to as a binge metal layer, as might be used in a DMD structure.

The conductive layer 410 illustrated in FIG. 4 may be formed using various different processes. In one embodiment, however, the conductive layer 410 is sputter deposited. Other processed could also be used.

Figure 5:
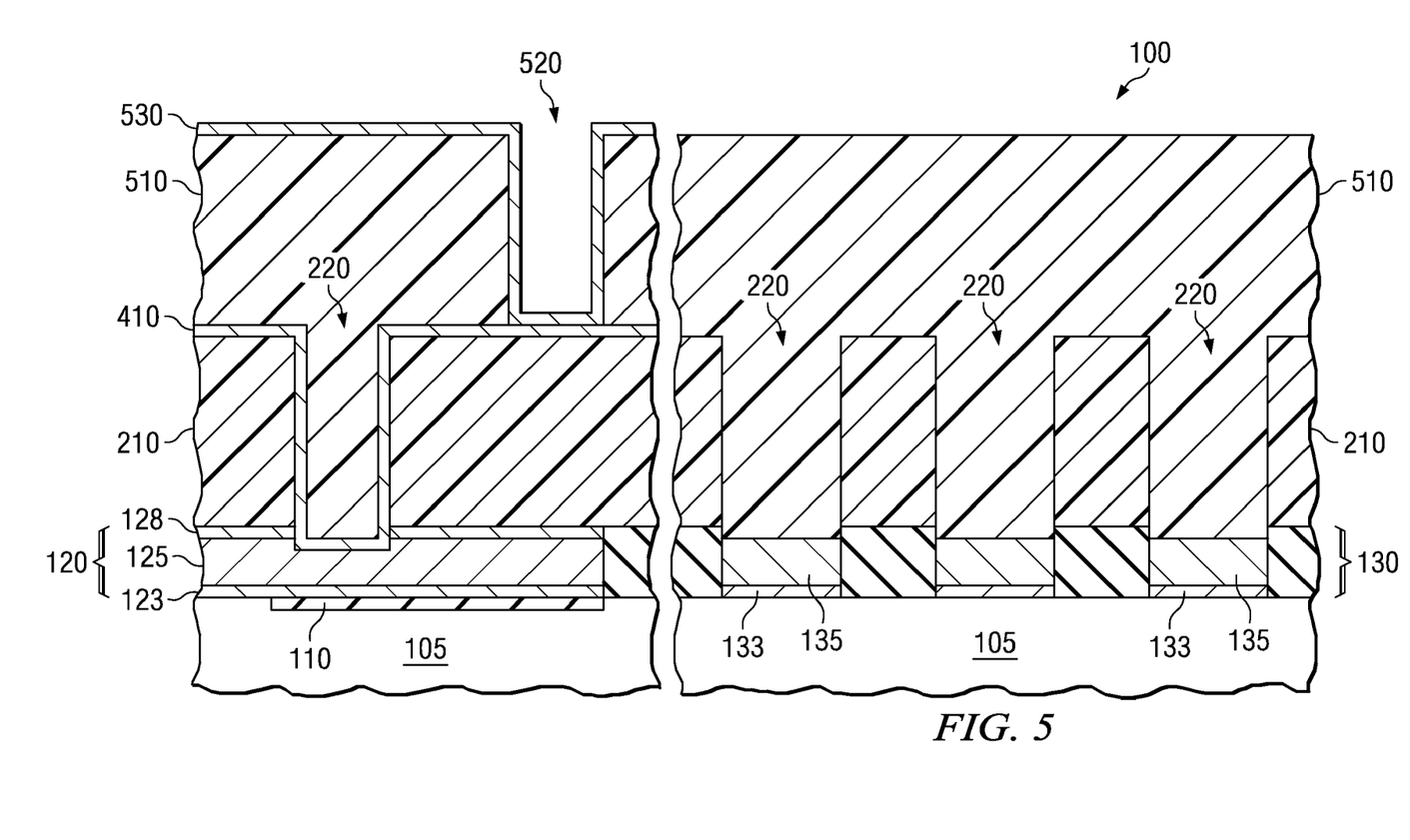

FIG. 5 illustrates the DMD 100 of FIG. 4 after forming a second spacer layer 510 over the first conductive layer 410, and forming a second conductive layer 530 over and within one or more openings 520 within the second spacer layer 510. In one embodiment, the spacer layer 510 is formed by spin depositing a photoresist to a thickness ranging from about 500 nm to about 1500 nm. Thereafter, the one or more openings 520 may be formed within the spacer layer 510. Conventional patterning and etching techniques may be used to form the opening 520 in the spacer layer 510, including a process substantially similar to that used to form the openings 220 in the first spacer layer 210. The patterned spacer layer 510 may then be deep UV hardened to a temperature of around about 175° C. to prevent flow and bubbling during subsequent processing steps.

The second conductive layer 530, in this embodiment, forms at least a portion of a mirror structure for the DMD 100. The conductive layer 530 may comprise a similar material and be manufactured using a similar process as the first conductive layer 410. Nevertheless, other materials and manufacturing processes might be used for the second conductive layer 530.

Figure 6:
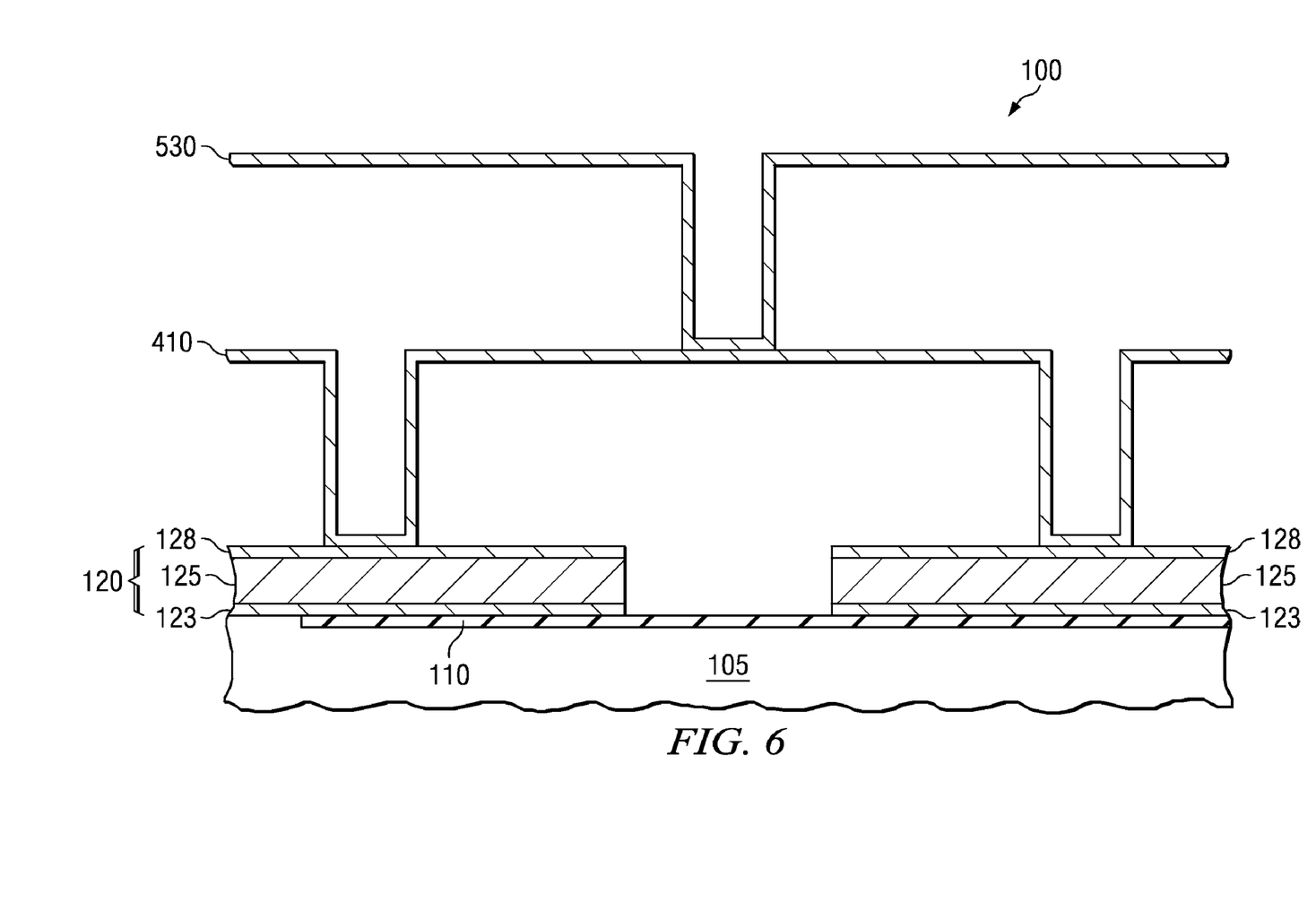

FIG. 6 illustrates the DMD 100 of FIG. 5 after patterning the second conductive layer 530 and then removing the first spacer layer 210 and the second spacer layer 510. As those skilled in the art appreciate, an etch mask, such as a plasma-deposited silicon dioxide etch mask, may be used to assist in the etching of the conductive layer 530. Nevertheless, other masks and processes might be used to pattern the conductive layer 530.

The removal of the first spacer layer 210 and of the second spacer layer 510 may be conventional. For example, a conventional downstream plasma ashing or other similar process may be used to remove the spacer layer 210 and the spacer layer 510. Nevertheless, other known or hereafter discovered processes could also be used while staying within the scope of the invention.

The DMD 100 of FIG. 6 may be but one of an array of such structures that might be located over the substrate 105. For instance, many thousands of such DMD structures 100 are often formed over a single substrate 105. Accordingly, the invention should not be limited to a single DMD 100 located over a single substrate 105.

Numerous benefits may be achieved using the invention. For example, the invention may be used to quantify the over-etch of the conductive feature in a timely manner. Accordingly, any issues that may result from the over-etch may be quickly determined, and thus corrected prior to taking many, if any, additional manufacturing steps. Other benefits also exist.

Figure 7:
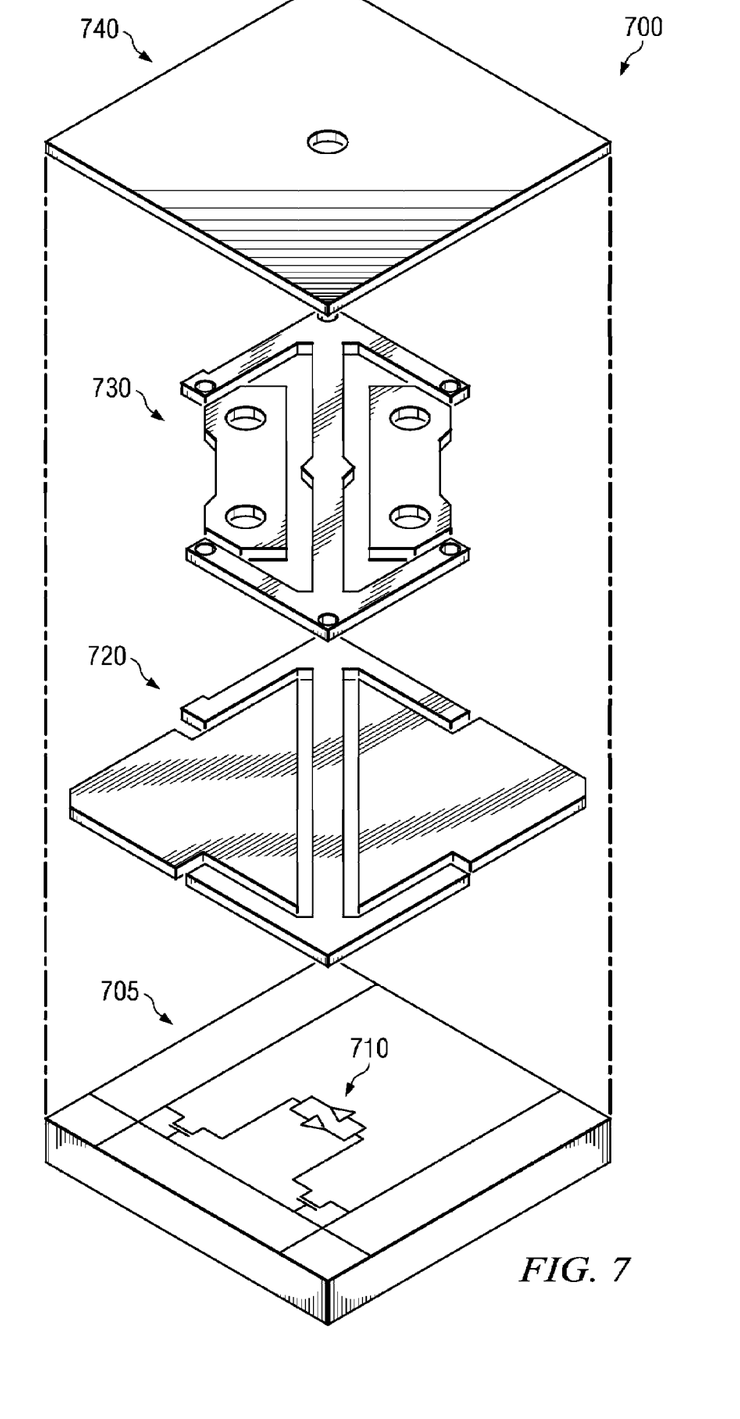
FIG. 7 illustrates an exploded view of a completed DMD manufactured in accordance with the invention.

FIG. 7 illustrates an exploded view of a completed DMD 700 manufactured in accordance with the invention. The DMD 700, among other elements, includes a substrate 705 having control circuitry 710 located therein or thereon and a patterned conductive feature 720 located over the circuitry 710. The DMD 700 may further include a patterned hinge 730 located over the conductive feature 720 and a patterned mirror 740 located over the hinge 730. The substrate 705, circuitry 710, conductive feature 720, hinge 730, and mirror 740 may be the same or slight variations of the embodiment discussed above in FIG. 6.

Figure 8:
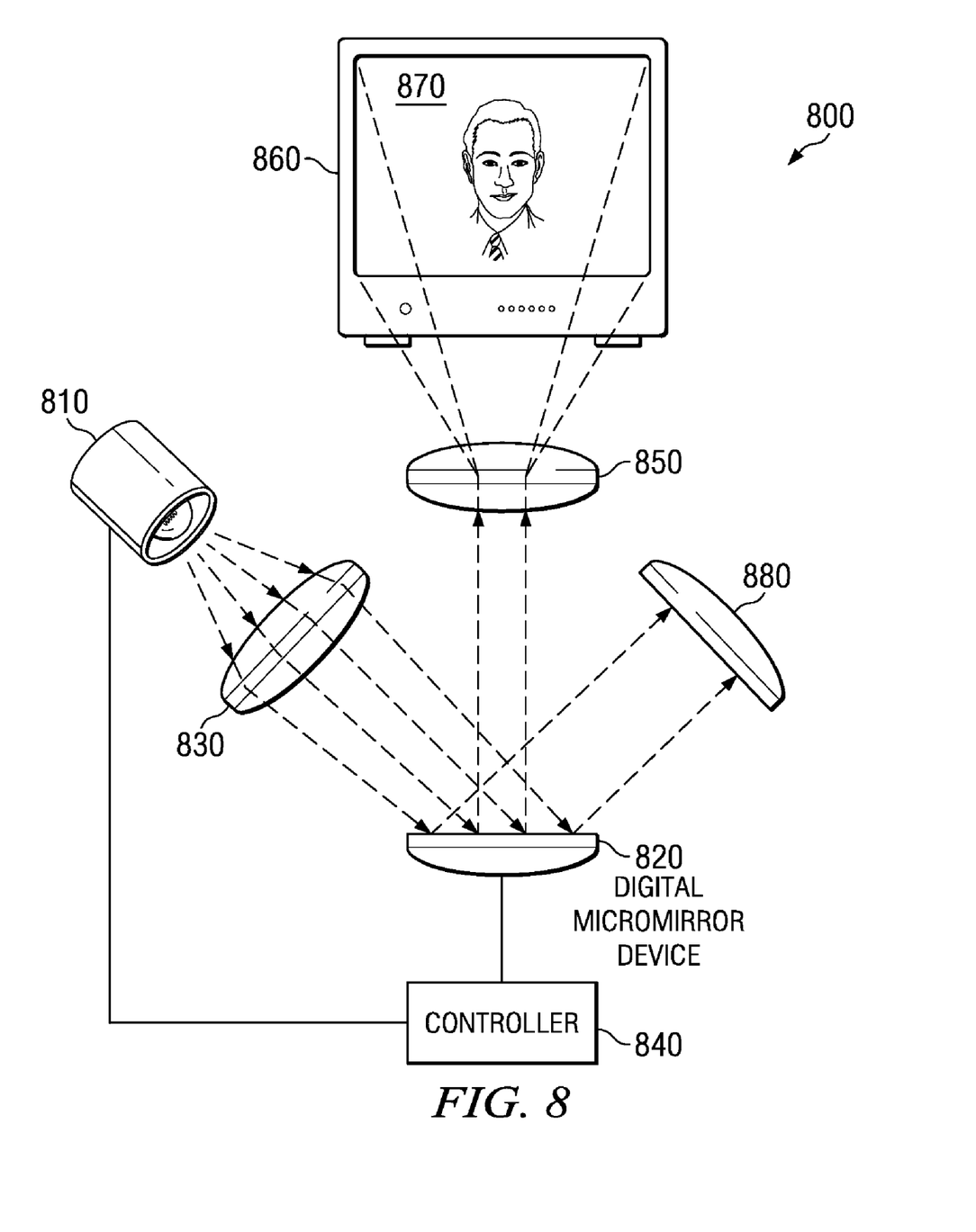
FIG. 8 illustrates a block diagram of a projection display system incorporating DMD's manufactured in accordance with the invention.

FIG. 8 illustrates a block diagram of a projection display system 800 incorporating DMD's manufactured in accordance with the invention. In the projection display system illustrated in FIG. 8, illumination from a light source 810 is focused onto the surface of one or more DMD's 820 by means of a condenser lens 830 placed in the path of the light. An electronic controller 840 is connected to both the DMD's 820 and the light source 810 and used to modulate the DMD's 820 and to control the light source 810.

For all DMD pixels in the ON state, the incoming light beam is reflected into the focal plane of a projection lens 850, where it is magnified and projected on to a viewing screen 860 to form an image 870. On the other hand, DMD pixels in the OFF state, as well as any stray light reflected from various near flat surfaces on and around the DMD's, are reflected into a light trap 880 and discarded.

Those skilled in the art to which the invention relates will appreciate that other and further additions, deletions, substitutions and modifications may be made to the described embodiments without departing from the scope of the invention.

What is claimed is:

1. A method for quantifying over-etch of a conductive feature, comprising:
   forming a conductive feature over a substrate, the conductive feature having a sheet resistance test structure associated therewith, the sheet resistance test structure having a first sheet resistance value;
   etching the conductive feature and the sheet resistance test structure using a common etch process;
   obtaining a second sheet resistance value of the sheet resistance test structure after the etching; and
   quantifying an amount of over-etch into the conductive feature using the first and second sheet resistance values, wherein quantifying includes quantifying using a ratio of the first and second sheet resistance values.

2. The method as recited in claim 1 wherein the conductive feature has an as-formed thickness, and wherein the quantifying is independent of the as-formed thickness.

3. The method as recited in claim 1 wherein the quantifying includes quantifying using the equation $$A = \frac{RS2 - RS1}{RS1 \times RS2}(K)(e^5),$$

wherein A is the amount of over-etch, RS1 is the first sheet resistance value, RS2 is the second sheet resistance value, and K is a resistance coefficient of the conductive feature.

4. The method as recited in claim 1 wherein the etching include simultaneously etching the conductive feature and the sheet resistance test structure.

5. The method as recited in claim 1 wherein forming the conductive feature includes simultaneously forming the conductive feature and the sheet resistance test structure.

6. The method as recited in claim 5 further including using the sheet resistance test structure to measure an as-formed thickness of the conductive feature prior to the etching.

7. The method as recited in claim 1 wherein the sheet resistance test structure is positioned within a scribe line of a semiconductor wafer.

8. A method for manufacturing a microelectronic device, comprising:
   forming a conductive feature over a substrate, the conductive feature having a sheet resistance test structure associated therewith, the sheet resistance test structure having a first sheet resistance value;
   forming a photoresist spacer layer over the conductive feature, the photoresist spacer layer having one or more openings therein;
   etching the sheet resistance test structure and etching the conductive feature through the one or more openings in the photoresist spacer layer using a common etch process;
   obtaining a second sheet resistance value of the sheet resistance test structure after the etching;
   quantifying an amount of over-etch into the conductive feature using the first and second sheet resistance values; and
   forming a conductive layer over the photoresist spacer layer and within the one or more openings.

9. The method as recited in claim 8 wherein forming the conductive layer occurs after quantifying.

10. The method as recited in claim 8 wherein the conductive feature has an as-formed thickness, and wherein the quantifying is independent of the as-formed thickness.

11. The method as recited in claim 8 wherein the quantifying includes quantifying using a ratio of the first and second sheet resistance values.

12. The method as recited in claim 8 wherein the quantifying includes quantifying using the equation $$A = \frac{RS2 - RS1}{RS1 \times RS2}(K)(e^5),$$

wherein A is the amount of over-etch, RS1 is the first sheet resistance value, RS2 is the second sheet resistance value, and K is a resistance coefficient of the conductive feature.

13. The method as recited in claim 8 wherein the etching includes simultaneously etching the conductive feature and the sheet resistance test structure.

14. The method as recited in claim 8 wherein forming the conductive feature includes simultaneously forming the conductive feature and the sheet resistance test structure.

15. The method as recited in claim 14 further including using the sheet resistance test structure to measure an as-formed thickness of the conductive feature prior to the etching.

16. The method as recited in claim 8 wherein the sheet resistance test structure is positioned within a scribe line of a semiconductor wafer.

17. The method as recited in claim 8 wherein the conductive layer forms at least a portion of a hinge structure for a digital micromirror device.

18. The method as recited in claim 8 wherein the photoresist spacer layer is a first photoresist spacer layer and further including;

forming a second photoresist spacer layer over the conductive layer, the second photoresist spacer layer having one or more openings therein; and forming a second conductive layer over the second spacer layer and within the one or more openings of the second spacer layer.

19. The method as recited in claim 18 wherein the conductive layer forms at least a portion of a hinge structure for a digital micromirror device and the second conductive layer forms at least a portion of a mirror structure for the digital micromirror device.

* * * * *